United States Patent
Yoo et al.

(10) Patent No.: US 9,982,192 B2
(45) Date of Patent: May 29, 2018

(54) RED LIGHT EMITTING PHOSPHOR, METHOD FOR PRODUCING THE SAME AND LIGHT EMITTING DEVICE PACKAGE INCLUDING THE SAME

(71) Applicant: LG ELECTRONICS INC., Seoul (KR)

(72) Inventors: Younggil Yoo, Seoul (KR); Gunyoung Hong, Seoul (KR); Kyungpil Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 178 days.

(21) Appl. No.: 14/780,261

(22) PCT Filed: Aug. 28, 2014

(86) PCT No.: PCT/KR2014/008011
§ 371 (c)(1),
(2) Date: Sep. 25, 2015

(87) PCT Pub. No.: WO2015/060531
PCT Pub. Date: Apr. 30, 2015

(65) Prior Publication Data
US 2016/0040065 A1 Feb. 11, 2016

(30) Foreign Application Priority Data

Oct. 21, 2013 (KR) .................. 10-2013-0125250

(51) Int. Cl.
*C09K 11/78* (2006.01)
*C09K 11/55* (2006.01)
*H01L 33/50* (2010.01)
*C09K 11/77* (2006.01)

(52) U.S. Cl.
CPC ........ *C09K 11/7787* (2013.01); *H01L 33/502* (2013.01)

(58) Field of Classification Search
CPC .................... C09K 11/7787; H01L 33/502
See application file for complete search history.

(56) References Cited

U.S. PATENT DOCUMENTS 3,450,642 A * 6/1969 Hoffman ............ C09K 11/7766
252/301.4 R
2008/0001122 A1  1/2008 Odaki et al.

FOREIGN PATENT DOCUMENTS

| JP | 2013-091805 A | 5/2013 |
| KR | 10-0846482 B1 | 7/2008 |
| KR | 10-2012-0030286 A | 3/2012 |
| KR | 10-2013-0088853 A | 8/2013 |

OTHER PUBLICATIONS

Zhou et al, "Synthesis and photoluminescence propeties of SrLu2O4:Eu3+ superfine phosphor", Materials Research Bulletin, vol. 40, issue 10, 2005, pp. 1832-1838.*
Zhou et al, "Prepartion of SrR2O4:Eu3+ (R=Y,Lu) phosphor and its photoluminescence properties", Materials Letters, 59 (16), Jul. 2005, pp. 2079-2084.*
International Search Report issued in Application No. PCT/KR2014/008011 dated Dec. 15, 2014.

* cited by examiner

*Primary Examiner* — C Melissa Koslow
(74) *Attorney, Agent, or Firm* — KED & Associates, LLP

(57) ABSTRACT

Disclosed are a phosphor, in particular, a red light emitting phosphor, a method for producing the same and a light emitting device package including the same. Provided is a red light emitting phosphor emitting light having a main absorption band in a blue wavelength range and a main peak in a red wavelength range, the red light emitting phosphor being represented by the following Formula 1.

$(Sr_{1-x}Eu_x)Lu_2O_4$  [Formula 1]

9 Claims, 4 Drawing Sheets

RED LIGHT EMITTING PHOSPHOR, METHOD FOR PRODUCING THE SAME AND LIGHT EMITTING DEVICE PACKAGE INCLUDING THE SAME

CROSS-REFERENCE TO RELATED PATENT APPLICATIONS

This application is a U.S. National Stage Application under 35 U.S.C. § 371 of PCT Application No. PCT/KR2014/008011, filed Aug. 28, 2014, which claims priority to Korean Patent Application No. 10-2013-0125250, filed Oct. 21, 2013, whose entire disclosures are hereby incorporated by reference.

TECHNICAL FIELD

The present invention relates to a phosphor, and more particularly, to a red-emitting phosphor, a method for producing the same and a light emitting device package including the same.

BACKGROUND ART

Light emitting diodes (LEDs) emitting white light are next-generation light emitting device candidates which can replace fluorescent lights, as the most representative conventional lights.

Light emitting diodes have low power consumption as compared to conventional light sources and are environmentally friendly because they do not contain mercury, unlike fluorescent lights. In addition, light emitting diodes have advantages of long lifespan and high response speed as compared to conventional light sources.

There are three methods for producing white light emitting diodes. These methods include implementation of white light by combination of red, green and blue LEDs, implementation of white light by applying a yellow phosphor to blue LEDs and implementation of white light by combination of red, green and blue LEDs with a UV LED.

Of these, the implementation of white light by applying the yellow phosphor to blue LEDs is the most representative method for obtaining white light using light emitting diodes.

White light emitted by this method has high brightness, but readily causes scintillation resulting from color separation due to great wavelength gap between blue and yellow, thus making mass-production of white LEDs having the same color coordinates difficult.

Furthermore, it is not easy to control color temperature and color rendering index (CRI) which are essential factors in light sources for lights.

Under this situation, in an attempt to solve these disadvantages, emission spectrums are widened by adding phosphors emitting red light, but there is a need for further research on development of materials for phosphors emitting red light and improvement of efficiency.

DISCLOSURE

Technical Problem

An object of the present invention devised to solve the problem lies on a red-emitting phosphor having high photo-conversion efficiency and superior color purity using a near-ultraviolet or blue excitation source, a method for producing the same and a light emitting device package using the same.

Technical Solution

The object of the present invention can be achieved by providing a red light emitting phosphor emitting light having a main absorption band in a blue wavelength range and a main peak in a red wavelength range, the red light emitting phosphor represented by the following Formula 1.

$(Sr_{1-x}Eu_x)Lu_2O_4$     [Formula 1]

Light of the red wavelength range may have a central wavelength of 610 nm to 620 nm.

The red wavelength range may include at least a part of a range of 620 nm to 800 nm.

The blue wavelength range may include at least a part of a range of 350 nm to 500 nm.

In Formula 1, x may be 0.001 to 0.1 (0.1% to 10% with respect to Sr).

In Formula 1, more specifically, x may be 0.005 to 0.03 (0.5% to 3% with respect to Sr).

In a further aspect of the present invention, provided herein is a method for producing a red light emitting phosphor, wherein the red light emitting phosphor is produced such that the red light emitting phosphor emits light having a main absorption band in a blue wavelength range and a main peak in a red wavelength range and includes a compound represented by the following Formula 1 in which europium (Eu) is substituted with strontium (Sr).

$(Sr_{1-x}Eu_x)Lu_2O_4$     [Formula 1]

The production of the phosphor may be carried out using at least one of $Sr_3N_2$, $SrCO_3$, $Lu_2O_3$ and $Eu_2O_3$ as a raw material.

The production of the phosphor may be carried out at a pressure of 9 atm or higher.

The production of the phosphor may be carried out at a temperature of 1,000° C. or higher.

Light of the red wavelength range may have a central wavelength of 610 nm to 620 nm.

The red wavelength range may include at least a part of a range of 620 nm to 800 nm.

In a further aspect of the present invention, provided herein is a method for producing a red light emitting phosphor, wherein the red light emitting phosphor is produced such that the red light emitting phosphor emits light having a main absorption band in a blue wavelength range and a main peak in a red wavelength range and includes a compound represented by the following Formula 1, produced using at least one of strontium oxide, lutetium oxide and europium oxide and a nitride-based material.

$(Sr_{1-x}Eu_x)Lu_2O_4$     [Formula 1]

In a further aspect of the present invention, provided herein is a light emitting device package including the phosphor described above or the phosphor represented by Formula 1 produced by the method described above.

Advantageous Effects

The present invention has the following advantages.

The present invention provides a phosphor having a high efficiency at a long wavelength of 400 nm or more and emitting red light having a strong and wide band.

The phosphor according to the present invention greatly improves efficiency of light emitting devices using a blue excitation source as a light source, in particular, LEDs (phosphor converted LEDs) using phosphors such as white LEDs using yellow phosphors and blue LEDs, and lighting and display devices using light emitting devices having an emission wavelength of 400 nm or more as excitation light sources.

The red light emitting phosphor according to the present invention is a novel phosphor not developed to date and is used for light emitting devices or display devices.

The technical effects of the present invention are not limited to those described above and other effects not described herein will be clearly understood by those skilled in the art from the following description.

DESCRIPTION OF DRAWINGS

The accompanying drawings, which are included to provide a further understanding of the invention, illustrate embodiments of the invention and together with the description serve to explain the principle of the invention.

In the drawings.

BEST MODE

Figure 1:
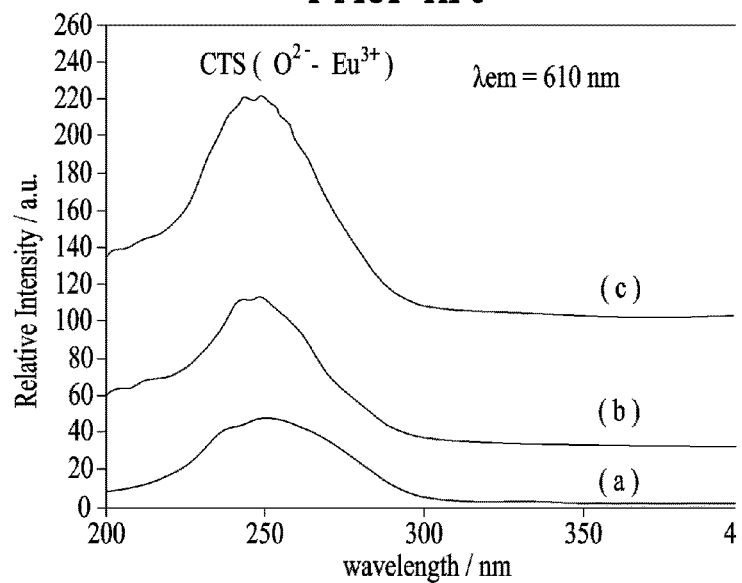
FIG. 1 illustrates an excitation spectrum of $SrLu_2O_4:Eu^{3+}$.

Reference will now be made in detail to the preferred embodiments of the present invention, examples of which are illustrated in the accompanying drawings.

However, the present invention allows various modifications and variations and specific embodiments thereof are exemplified with reference to the drawings and will be described in detail. The present invention should not be construed as limited to the embodiments set forth herein and includes modifications, equivalents and substitutions compliant with the spirit or scope of the present invention defined by the appended claims.

It will be understood that when an element such as a layer, area or substrate is referred to as being "on" another element, it may be directly on the element, or one or more intervening elements may also be present therebetween.

In addition, it will be understood that although terms such as "first" and "second" may be used herein to describe elements, components, areas, layers and/or regions, the elements, components, areas, layers and/or regions should not be limited by these terms.

The present invention provides a red light emitting phosphor which emits light having a main absorption band in a blue wavelength range and a main peak in a red wavelength range and is represented by the following Formula 1.

$$(Sr_{1-x}Eu_x)Lu_2O_4 \quad \text{[Formula 1]}$$

In this case, light of the red wavelength range may have a central wavelength at 610 nm to 620 nm. That is, the main peak disposed in the red wavelength range is present in a wavelength range of 610 nm to 620 nm.

In addition, the red wavelength range may include at least a part of a range of 620 nm to 800 nm.

Here, the blue wavelength range may include at least part of a range of 350 nm to 500 nm.

Accordingly, such a red light emitting phosphor is excited by blue light emitted from blue light emitting devices including light emitting diodes (LEDs) and laser diodes (LDs) and may then emit red light.

In addition, such a red light emitting phosphor is excited by near-ultraviolet light and may then emit red light.

In Formula 1, x satisfies 0.001 to 0.1 (0.1% to 10% with respect to Sr). That is, europium (Eu) may be present in an amount of 0.1% to 10% with respect to strontium (Sr).

More specifically, x satisfies 0.005 to 0.03 (0.5% to 3% with respect to Sr). That is, europium (Eu) may be present in an amount of 0.5% to 3% with respect to strontium (Sr).

When a content ratio of europium (Eu) with respect to strontium (Sr) having x defined above is satisfied, the red light emitting phosphor has optimal excitation wavelength, emission wavelength and luminous efficacy.

That is, when x is 0.001 to 0.1, a phosphor which is excited by blue light and emits red light is obtained, but more specifically, when x is 0.005 to 0.03, optimal excitation wavelength, emission wavelength and luminous efficacy are obtained.

As such, the present invention provides a red phosphor which has high photo-conversion efficiency and superior color purity using a near-ultraviolet light emitting device and a blue light emitting device as an excitation source.

A common strontium lutetium oxide ($SrLu_2O_4$) phosphor substituted by (doped with) europium (Eu) has a structure in which $Lu^{3+}$ is substituted by $Eu^{3+}$.

That is, generally, when $SrLu_2O_4$ is substituted by europium (Eu), which is an active ion, Eu is oxidized by oxidation reaction using high-temperature synthesis and is thus present as $Eu^{3+}$, which is a stable form, and is substituted by $Lu^{3+}$ having an ionic radius similar to $Eu^{3+}$ to synthesize $SrLu_2O_4:Eu^{3+}$.

For reference, the ionic radius of Eu is 117 pm in the case of the bivalent ion ($Eu^{2+}$) and is 94.7 pm in the case of the trivalent ion ($Eu^{3+}$). The ionic radius of lutetium (Lu) is 86 pm in the case of the trivalent ion ($Lu^{3+}$) and the ionic radius of strontium (Sr) is 118 pm in the case of the bivalent ion ($Sr^{2+}$).

Accordingly, ions, such as $SrLu_2O_4:Eu^{3+}$, substituted by a trivalent rare earth metal, generally emit light by transition between 4f levels (4f-4f). Representative examples of these ions include $Eu^{3+}$, $Tb^{3+}$, $Sm^{3+}$, $Gd^{3+}$, $Pr^{3+}$, and $Dy^{3+}$.

As such, when the active ion is substituted by a trivalent ion, 4f electrons shielded by 5s and 5p electrons have considerably weak interaction with neighboring ions and thus considerably small crystal field size, the distance deviated from equilibrium location on a configuration coordinate diagram is considerably small.

Figure 2:
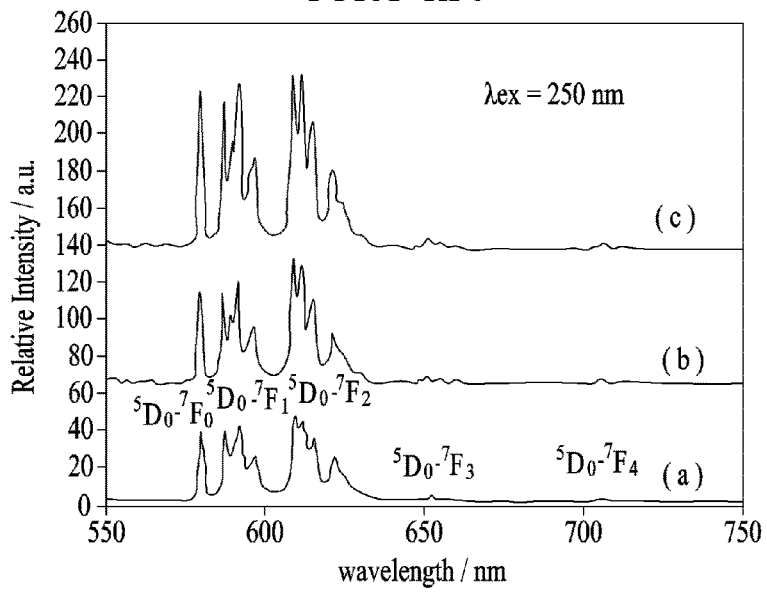
FIG. 2 illustrates an emission spectrum of $SrLu_2O_4:Eu^{3+}$.

Accordingly, inherent emission spectrums which do not greatly change according to composition of the matrix are shown in FIGS. 1 and 2 and emission bands are mostly narrow.

Accordingly, FIG. 1 shows an excitation spectrum of $SrLu_2O_4:Eu^{3+}$ and FIG. 2 shows an emission spectrum of $SrLu_2O_4:Eu^{3+}$.

$SrLu_2O_4:Eu^{3+}$ provides needle-shaped light emission of various peaks resulting from the 4f-4f transition of $Eu^{3+}$, which is a trivalent active ion, and is unsuitable as a fluorescent material for continuous light emitting devices such as lights.

In addition, as shown in FIG. 1, excitation wavelength is 250 nm and excitation efficiency is rapidly deteriorated at a wavelength higher than the excitation wavelength. Accordingly, $SrLu_2O_4:Eu^{3+}$ is inapplicable to ultraviolet (UV) and blue light sources having a wavelength of 400 nm or more.

Meanwhile, design of active ions causing 4f-5d transition is required in order to design phosphors having an excitation wavelength of 400 nm or more and a strong and wide emission band according to the present invention. Representative examples of active ions include $Ce^{3+}$, $Eu^{2+}$, $Sm^{2+}$, $Yb^{2+}$ and the like.

Thus, in the present invention, a europium (Eu) active ion present as a trivalent ($Eu^{3+}$) form is reduced into a bivalent cation ($Eu^{2+}$) and is substituted in the position of $Sr^{2+}$, thereby realizing phosphors providing strong and wide light emission through the 4f-5d transition of $Eu^{2+}$.

As described above, generally, when $SrLu_2O_4$ is substituted by europium (Eu), which is an active ion, Eu is oxidized by oxidation reaction using high-temperature synthesis and is thus present as $Eu^{3+}$, which is a stable form, and is substituted by $Lu^{3+}$ having an ionic radius similar to $Eu^{3+}$ to synthesize $SrLu_2O_4:Eu^{3+}$.

However, an oxide-based material is substituted by a nitride-based material upon high-temperature synthesis to maximize prevention of oxidization of the material during synthesis and synthesis is performed at a high pressure to block permeation of oxygen.

Thus, Eu ions are present in a bivalent form by such synthesis and Eu is substituted in the position of Sr having a similar ionic radius thereto, to synthesize $SrLu_2O_4:Eu^{2+}$.

The phosphor thus synthesized has a structure in which Eu is substituted in the position of Sr and is the same as the phosphor shown in Formula 1 described above.

Figure 3:
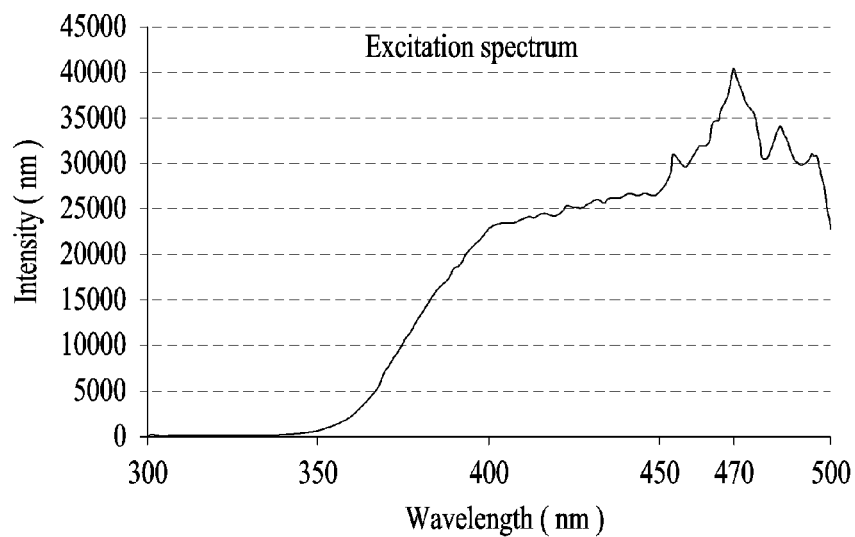
FIG. 3 illustrates an excitation spectrum of the red light emitting phosphor according to the present invention.
Figure 4:
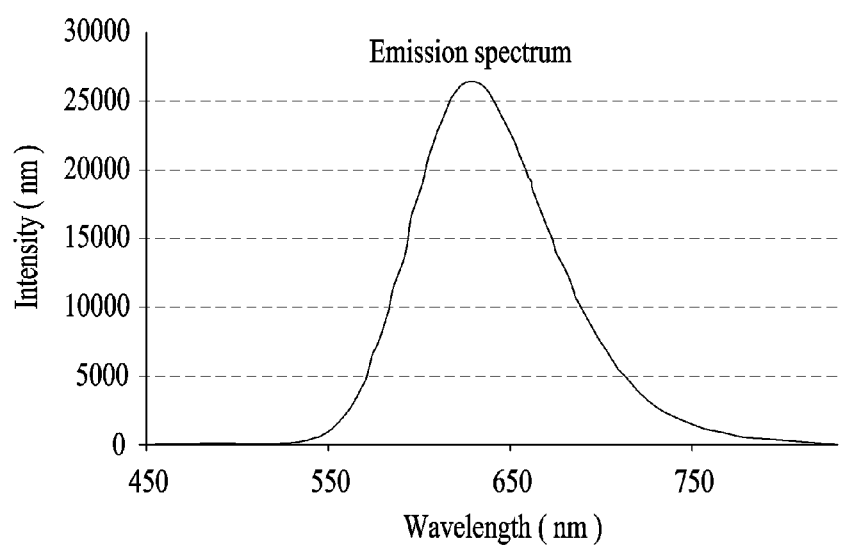
FIG. 4 illustrates an emission spectrum of the red light emitting phosphor according to the present invention.

FIG. 3 illustrates an excitation spectrum of the red light emitting phosphor according to the present invention and FIG. 4 illustrates an emission spectrum of the red light emitting phosphor according to the present invention.

As shown in FIG. 3, regarding the $SrLu_2O_4:Eu^{2+}$ phosphor thus synthesized, excitation efficiency is increased at a wavelength of 400 nm or more and maximum absorbance is observed at a wavelength of 470 nm.

In addition, as shown in FIG. 4, light emission having a wide band by the 4f-5d transition is seen. This is clearly distinguished from the emission spectrum by the transition between 4f levels shown in FIG. 2.

Figure 5:
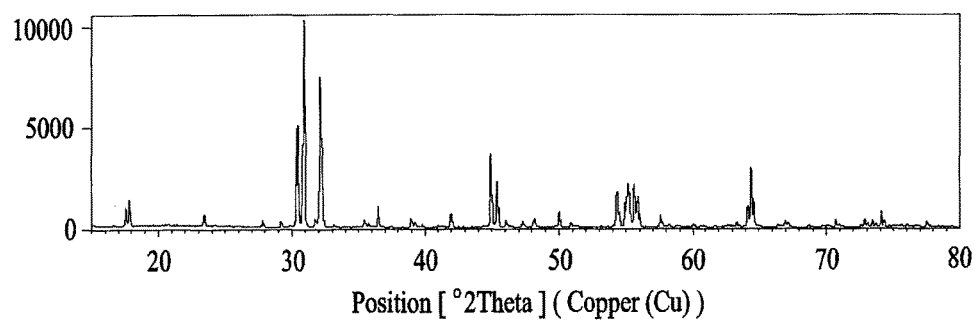
FIG. 5 illustrates an XRD spectrum of the red light emitting phosphor according to the present invention.
Figure 6:
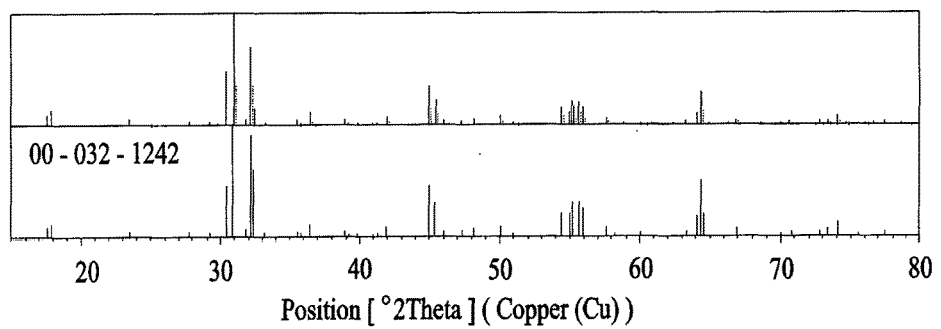
FIG. 6 is a view comparing a peak list of the XRD spectrum of the red light emitting phosphor with an ICOD database of a $SrLu_2O_4$ crystal structure.

FIG. 5 illustrates an XRD spectrum of a phosphor represented by Formula 1. FIG. 6 is a view comparing the peak list (top) of the XRD spectrum of the red light emitting phosphor with the ICOD database (reference code 00-032-1242; bottom) of a $SrLu_2O_4$ crystal structure.

That is, as can be seen from FIGS. 5 and 6, the phosphor synthesized by the present invention has the same crystal structure as that of $SrLu_2O_4$.

As described above, the red light emitting phosphor of the present invention represented by Formula 1 or $SrLu_2O_4:Eu^{2+}$ can be synthesized by preventing oxidization of Eu ions.

The method for preventing oxidization of $Eu^{2+}$ is as follows.

First, synthesis is performed at a relatively high pressure. Synthesis may be performed at a pressure of 9 atm or more.

Second, a nitride-based material is used as the material for phosphor synthesis. The nitride-based material is for example $Sr_3N_2$.

In addition, at least one of strontium oxide, lutetium oxide and europium oxide may be used.

In addition, the phosphor described above can be synthesized at a temperature of 1,000° C. or higher (at about 1,000° C. to about 1,600° C.) for 3 hours or longer.

Hereinafter, examples will be described in detail.

EXAMPLE

The red light emitting phosphor represented by Formula 1 is synthesized at a high pressure of 9 atm.

In addition, oxide and nitride based materials may be used as materials for the phosphor synthesis. Examples of the materials may be $Sr_3N_2$, $SrCO_3$, $Lu_2O_3$ and $Eu_2O_3$.

As such, the phosphor described above can be synthesized at 9 atm and at a temperature of 1,450° C. for 3 hours.

As can be seen from FIGS. 5 and 6, the synthesized phosphor has the same crystal structure as that of $SrLu_2O_4$.

As such, a phosphor substance with a novel composition serving as the phosphor can be manufactured by implementing emission of red light with high efficiency.

As apparent from the foregoing, the $SrLu_2O_4:Eu^{2+}$ phosphor causing 4f-5d transition synthesized according to the present invention reduces the active ion and substitutes the same in the position of $Sr^{2+}$, thereby providing a phosphor having improved excitation efficiency at a long wavelength of 400 nm or more and emitting red light having a strong and wide band.

The phosphor according to the present invention greatly improves efficiency of light emitting devices using a blue excitation source as a light source, in particular, LEDs (phosphor converted LEDs) using phosphors such as white LEDs using yellow phosphors and blue LEDs, and lighting and display devices using light emitting devices having an emission wavelength of 400 nm or more as excitation light sources.

The red light emitting phosphor according to the present invention is a novel phosphor not developed to date and is used for light emitting devices or display devices.

Figure 7:
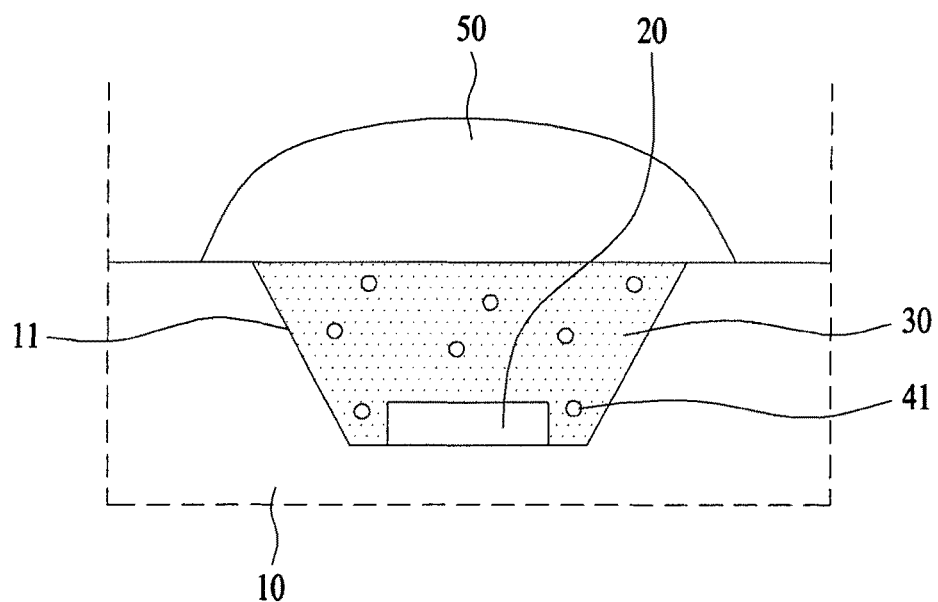
FIG. 7 is a schematic view illustrating an example of a light emitting device package using the red light emitting phosphor according to the present invention.

FIG. 7 illustrates an example of a light emitting device package using the red light emitting phosphor according to the present invention.

A light emitting device 20 is mounted inside a reflection cup 11 formed in a package body 10 and the red light emitting phosphor 41 is provided in a lower part of the light emitting device 20.

In this case, an encapsulation 30 is disposed on the light emitting device 20 in the reflection cup 11 and the phosphor 41 is homogeneously mixed with the encapsulation 30.

In addition, a lens 50 capable of focusing light emitted from the light emitting device 20 may be provided on the encapsulation 30 and the phosphor 41.

Figure 8:
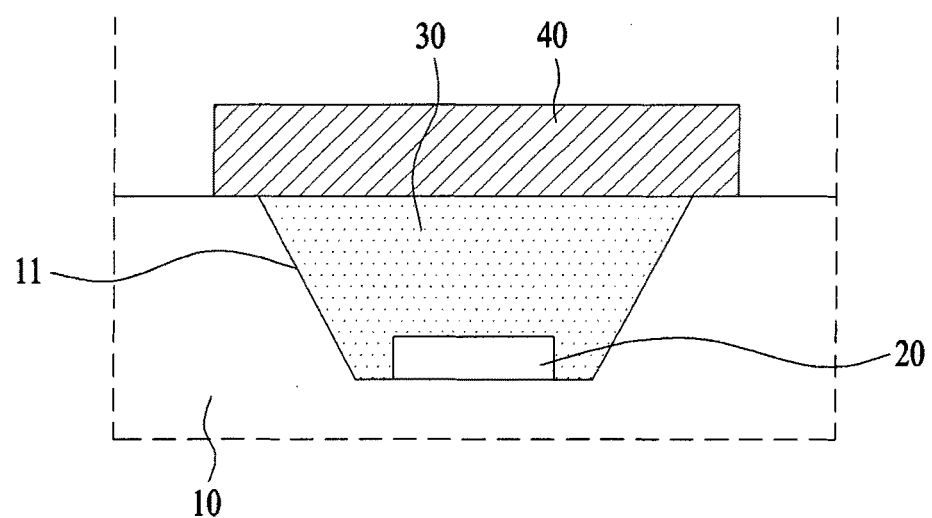
FIG. 8 is a schematic view illustrating another example of a light emitting device package using the red light emitting phosphor according to the present invention.

FIG. 8 illustrates another example of a light emitting device package using the red light emitting phosphor according to the present invention.

As shown in the drawing, a phosphor layer 40 is separately produced using the red light emitting phosphor to constitute the light emitting device package.

That is, the light emitting device 20 is mounted inside the reflection cup 11 formed in the package body 10 and the encapsulation 30 is disposed in the upper part of the light emitting device 20.

In this case, the phosphor layer 40 separated from the light emitting device 20 is disposed on the encapsulation 30.

Examples in which the red light emitting phosphor is used for the light emitting device package have been described, but the red light emitting phosphor may be used for other display devices such as PDPs, CRTs and FEDs.

Meanwhile, it will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

INDUSTRIAL APPLICABILITY

The phosphor according to the present invention greatly improves efficiency of light emitting devices using a blue excitation source as a light source, in particular, LEDs (phosphor converted LEDs) using phosphors such as white LEDs using yellow phosphors and blue LEDs, and light and display devices using light emitting devices having an emission wavelength of 400 nm or more as excitation light sources.

The red light emitting phosphor according to the present invention is a novel phosphor not developed to date and is used for light emitting devices or display devices.

The invention claimed is:

1. A red light emitting phosphor emitting light having a main absorption band in a blue wavelength range and a main peak in a red wavelength range, the red light emitting 5 phosphor represented by the following Formula 1, $(Sr_{1-x}Eu_x)Lu_2O_4$ [Formula 1]

wherein x is 0.001 to 0.1.

2. The red light emitting phosphor according to claim 1, wherein light of the red wavelength range has a peak wavelength of 610 nm to 620 nm.

3. The red light emitting phosphor according to claim 1, wherein the blue wavelength range comprises at least a part of a range of 350 nm to 500 nm.

4. The red light emitting phosphor according to claim 1, wherein x is 0.005 to 0.03.

5. A method for producing a red light emitting phosphor, the method comprising:
synthesizing the red light emitting phosphor using $Sr_3N_2$, $SrCO_3$, $Lu_2O_3$ and $Eu_2O_3$ as a raw material such that the red light emitting phosphor comprises a compound represented by the following Formula 1 in which europium (Eu) is substituted with strontium (Sr),
wherein synthesizing the red light emitting phosphor is performed at a pressure of 9 atm or more, and
wherein synthesizing the red light emitting phosphor is performed at a temperature of 1,000° C. or higher, $(Sr_{1-x}Eu_x)Lu_2O_4$, [Formula 1]

wherein x is 0.001 to 0.1.

6. The method according to claim 5, wherein the red light emitting phosphor emits light having a main peak in a red wavelength range, and wherein light of the red wavelength range has a peak wavelength of 610 nm to 620 nm.

7. The method according to claim 5, wherein the red light emitting phosphor emits light having a main absorption band in a blue wavelength range, and wherein the blue wavelength range comprises at least a part of a range of 350 nm to 500 nm.

8. The method according to claim 5, wherein x is 0.005 to 0.03.

9. A light emitting device package comprising the phosphor represented by Formula 1 according to claim 1.

* * * * *